(12) United States Patent
Dai et al.

(10) Patent No.: US 7,637,745 B1
(45) Date of Patent: Dec. 29, 2009

(54) COMMUNICATION SYSTEM AND ELECTRONIC DEVICE UTILIZING THE SAME

(75) Inventors: Lung Dai, Taipei Hsien (TW); Tao Wang, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/344,222

(22) Filed: Dec. 25, 2008

(30) Foreign Application Priority Data

Jun. 17, 2008 (CN) .................... 2008 1 0302160

(51) Int. Cl.
*H01R 39/00* (2006.01)
(52) U.S. Cl. .................... 439/28; 439/31; 439/165
(58) Field of Classification Search .................... 439/28, 439/31, 11, 13, 14, 18, 23, 165
See application file for complete search history.

(56) References Cited

U.S. PATENT DOCUMENTS

| | | | | |
|---|---|---|---|---|
| 3,425,021 A * | 1/1969 | Fow et al. | ...................... | 439/59 |
| 3,860,312 A * | 1/1975 | Gordon, Jr. | .................. | 439/31 |
| 4,850,882 A * | 7/1989 | Yu | .............................. | 439/31 |
| 4,865,553 A * | 9/1989 | Tanigawa et al. | .............. | 439/31 |
| 5,027,394 A * | 6/1991 | Ono et al. | .................... | 379/434 |
| 5,141,446 A * | 8/1992 | Ozouf et al. | ................ | 439/165 |
| 5,363,089 A * | 11/1994 | Goldenberg | .............. | 340/7.63 |
| 5,394,297 A | 2/1995 | Toedter | | |
| 5,395,248 A * | 3/1995 | Kinoshita et al. | ............. | 439/31 |
| 5,681,176 A * | 10/1997 | Ibaraki et al. | ............... | 439/165 |
| 5,995,373 A * | 11/1999 | Nagai | ......................... | 361/755 |
| 6,011,699 A * | 1/2000 | Murray et al. | .............. | 361/814 |
| 6,068,490 A * | 5/2000 | Salzberg | ...................... | 439/25 |
| 6,447,315 B1 * | 9/2002 | Pan et al. | .................... | 439/165 |
| 6,547,575 B2 * | 4/2003 | Kato et al. | ................... | 439/165 |
| 6,650,547 B2 * | 11/2003 | Hemmi et al. | .............. | 361/755 |
| 6,754,507 B2 * | 6/2004 | Takagi | ...................... | 455/550.1 |
| 6,829,490 B2 * | 12/2004 | Nakamura et al. | ........ | 455/550.1 |
| 6,872,088 B2 * | 3/2005 | Watanabe | .................... | 439/165 |
| 6,873,520 B2 * | 3/2005 | Takagi et al. | ........... | 361/679.55 |
| 6,895,638 B2 * | 5/2005 | Lin | ............................. | 16/368 |
| 6,926,546 B2 * | 8/2005 | Kurokawa | ................... | 439/165 |
| 6,959,210 B2 * | 10/2005 | Nakamura | ............... | 455/575.3 |
| 6,975,724 B2 * | 12/2005 | Shin | ...................... | 379/433.13 |
| 6,982,880 B2 * | 1/2006 | Takagi | ........................ | 361/814 |
| 7,094,084 B2 * | 8/2006 | Lee | .............................. | 439/165 |
| 7,097,479 B2 * | 8/2006 | Lee | .............................. | 439/165 |
| 7,214,067 B2 * | 5/2007 | Zaderej | ........................ | 439/31 |
| 7,232,313 B1 * | 6/2007 | Shinoda | ....................... | 439/31 |
| 7,248,903 B2 * | 7/2007 | Yoda | ....................... | 455/575.1 |

(Continued)

*Primary Examiner*—Ross N Gushi
(74) *Attorney, Agent, or Firm*—Frank R. Niranjan

(57) ABSTRACT

A communication system electrically connecting circuits in a hinged cover and base of an electronic device includes an arched first flat cable wrapping around and rotatable with respect to a hinge assembly, a straight second flat cable electrically connected to the first flat cable and disposed in the base, an arched third flat cable wrapping around the first flat cable electrically connected to and rotatable with respect to the first flat cable, and a straight fourth flat cable electrically connected to the third flat cable and disposed in the cover. Also provided is an electronic device including a base, a cover, a hinge assembly pivotally connecting the cover to the base, and the communication system.

10 Claims, 2 Drawing Sheets

U.S. PATENT DOCUMENTS

| | | | |
|---|---|---|---|
| 7,253,774 B2 * | 8/2007 | Kasamatsu et al. | 343/702 |
| 7,359,217 B2 * | 4/2008 | Pan | 361/814 |
| 7,448,891 B2 * | 11/2008 | Ahn | 439/165 |
| 7,466,558 B2 * | 12/2008 | Yasuda | 361/755 |
| 7,469,451 B2 * | 12/2008 | Hashizume | 16/386 |
| 7,558,078 B2 * | 7/2009 | Oowaki | 361/814 |
| 2003/0211873 A1 * | 11/2003 | Komiyama | 455/575.3 |
| 2004/0002241 A1 * | 1/2004 | Lee | 439/165 |
| 2004/0198417 A1 * | 10/2004 | Yoda | 455/550.1 |
| 2007/0123064 A1 * | 5/2007 | Shinoda | 439/31 |
| 2008/0076270 A1 * | 3/2008 | Jao et al. | 439/31 |

* cited by examiner

COMMUNICATION SYSTEM AND ELECTRONIC DEVICE UTILIZING THE SAME

BACKGROUND

1. Field of the Disclosure

Embodiments of the present disclosure relate to communications, and particularly relates to a communication system and electronic device utilizing the system.

2. Description of Related Art

Electronic devices often include a cover, a base, and a hinge assembly pivotally connecting the cover to the base, which often includes a processing circuit. The cover can include a display screen electrically connected to the processing circuit by cables or wires.

Conventionally, the often flat cables or wires may pass through a hole defined by the hinge assembly to electrically connect the processing circuit to the display screen, or proceed in a circular course bypassing the hinge assembly. However, when the cover rotates with respect to the base around the hinge assembly, the cables or wires frequently bend and can easily break with use.

Therefore, an improved communication system for an electronic device is needed to address the limitations described.

DETAILED DESCRIPTION OF CERTAIN INVENTIVE EMBODIMENTS

References will now be made to the drawings to describe certain inventive embodiments of the present disclosure.

Figure 1:
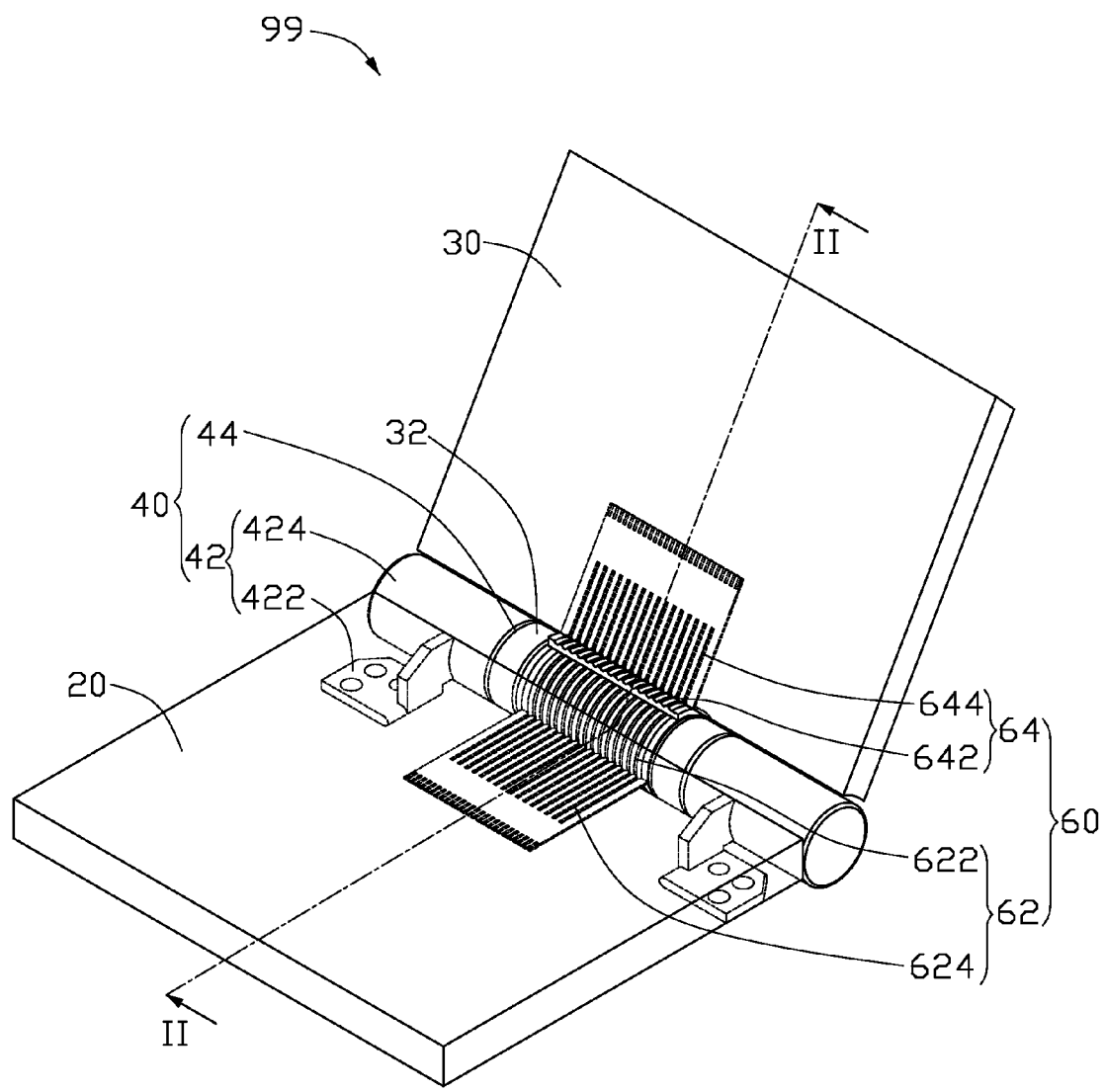
FIG. 1 is a diagram of an electronic device utilizing a communication system in accordance with the present disclosure.
Figure 2:
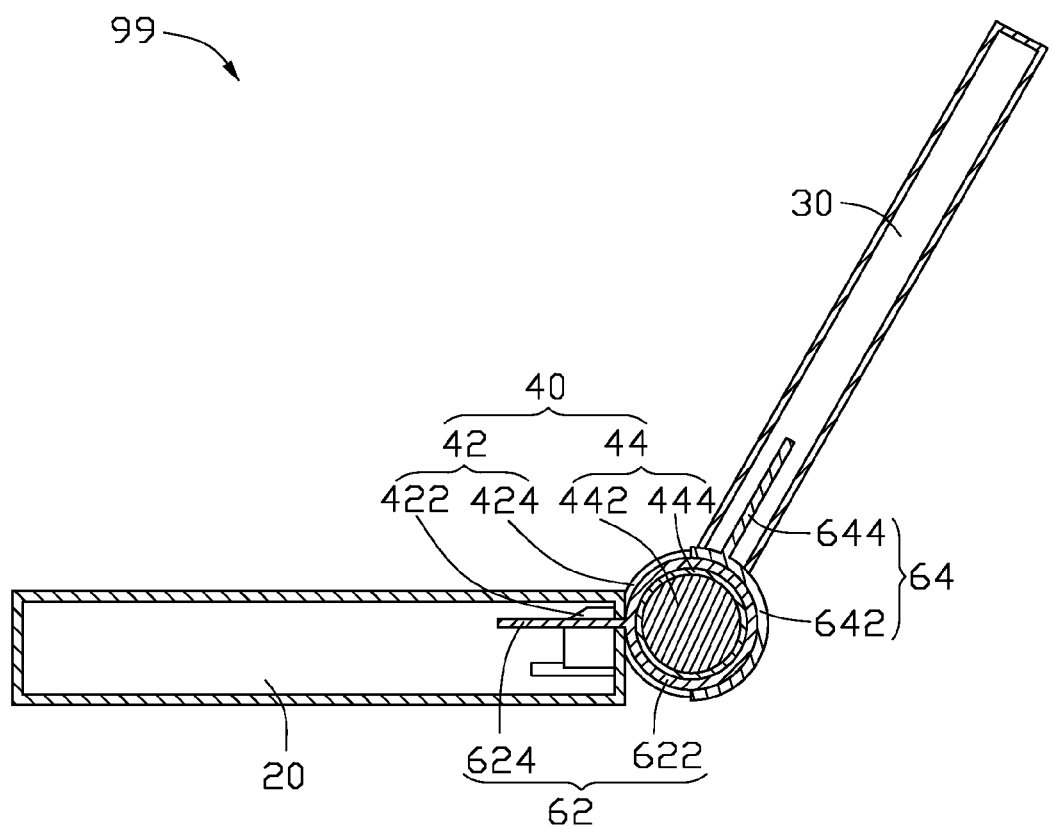
FIG. 2 is a cutaway view of the electronic device of FIG. 1 along a II-II axis.

Referring to FIG. 1, an electronic device 99 in accordance with an exemplary embodiment includes a base 20, a cover 30, a hinge assembly 40 pivotally connecting the cover 30 and the base 20, and a communication system 60 electrically connecting circuits (not shown) disposed in the cover 30 and the base 20.

The base 20 and the cover 30 are both substantially cuboid. The base 20 includes two fastening portions (not shown). The cover 30 includes a pair of sleeves 32 formed at a connecting side of the cover 30 connected to a connecting side of the base 20 via the hinge assembly 40. The two sleeves 32 have the same axis.

The hinge assembly 40 includes two first hinge subassemblies 42 and a second hinge subassembly 44 coaxially disposed between the two first hinge subassemblies 42. The two first hinge subassemblies 42 are fixed to the connecting side of one of the base 20 and the cover 30. The second hinge subassembly 44 is fixed to the connecting side of the other of the base 20 and the cover 30. In this embodiment, the two first hinge subassemblies 42 are fixed to the connecting side of the base 20, and adopted as an axle bed. The second hinge subassembly 44 is fixed to the connecting side of the cover 30, and adopted as an axle body.

Each of the two first hinge subassemblies 42 includes a fastening arm 422 and a first joint axle 424 fixed to the fastening arm 422. The fastening arm 422 is fixed to one of the fastening portions of the base 20. The fastening arm 422 includes a first plate with mounting holes defined thereon, and a second plate substantially perpendicular to the first plate. The first plate is secured to the one of the fastening portions of the base 20 via fastening elements, such as rivets. The second plate is fixed to the first joint axle 424. The first joint axle 424 has substantial cylinder structures, and defines a cylindrical hole in a center of a flat side surface facing the second hinge subassembly 44.

Two ends of the second hinge subassembly 44 extend through the pair of sleeves 32 of the cover 30, and further engage the cylindrical holes of the two first joint axles 424 respectively. The second hinge subassembly 44 is non-rotatably fixed to the sleeves 32, and rotatably engages the first joint axles 424. The second hinge subassembly 44 and the sleeves 32 rotate synchronously with respect to the first joint axles 424. Thus, the cover 30 is pivotally connected to the base 20 via the hinge assembly 40. In other embodiments, two poles can be formed at two ends of the second hinge subassembly 44 correspondingly. The poles engage the cylindrical holes of the two first joint axles 424 respectively, and rotate with respect to the first joint axles 424.

The second hinge subassembly 44 includes a second joint axle 442, and an insulating sleeve 444 sleeved on the second joint axle 442. The second joint axle 442 is metal. The insulating sleeve 444 insulates the communication system 60 from the second joint axle 442. In other embodiments, the insulating sleeve 444 may be omitted, and an outer surface of the second joint axle 442 may be insulating materials.

The communication system 60 includes a first signal line 62 and a second signal line 64. The first signal line 62 includes an arched first flat cable 622, and a straight second flat cable 624 disposed in the base 20. An end of the second flat cable 624 is connected to the circuits in the base 20, and the other end of the second flat cable 624 is connected to the first flat cable 622, being non-rotatable with respect to the second flat cable 624. The first flat cable 622 wraps around the second hinge subassembly 44, and is rotatable with respect thereto.

The second signal line 64 includes an arched third flat cable 642, and a straight fourth flat cable 644 disposed in the cover 30. The third flat cable 642 is wrapped around and electrically connected to the first flat cable 622. The third flat cable 642 is non-rotatable with respect to the fourth flat cable 644. An end of the fourth flat cable 644 is connected to the circuits in the cover 30, and the other end of the fourth flat cable 644 is connected to the third flat cable 642. When the cover 30 rotates with respect to the base 20 around the hinge assembly 40, the first flat cable 622 does not rotate with respect to the first joint axle 424, and the third flat cable 642 rotates with respect to the first flat cable 622 in accordance with the rotation of the second hinge subassembly 44 and the cover 30, thus the first and second signal lines 62, 64 do not bend or flex when the cover 30 rotates with respect to the base 20.

It is to be understood, however, that even though numerous characteristics and advantages of the present disclosure have been set forth in the foregoing description, together with details of the structure and function of the present disclosure, the present disclosure is illustrative only, and changes may be made in detail, especially in matters of shape, size, and arrangement of parts within the principles of the present disclosure to the full extent indicated by the broad general meaning of the terms in which the appended claims are expressed.

What is claimed is:

1. A communication system electrically connecting circuits in a hinged cover and base of an electronic device, the communication system comprising:

an arched first flat cable wrapping around a hinge assembly pivotally connecting the cover to the base, rotatable with respect thereto;

a straight second flat cable electrically connected to the first flat cable and disposed in the base;

an arched third flat cable wrapping around the first flat cable, electrically connected to the first flat cable, and rotatable with respect to the first flat cable; and a straight fourth flat cable electrically connected to the third flat cable and disposed in the cover.

2. The communication system as claimed in claim 1, wherein the first flat cable is non-rotatable with respect to the second flat cable.

3. The communication system as claimed in claim 1, wherein the third flat cable is non-rotatable with respect to the fourth flat cable.

4. An electronic device, comprising:

a base;

a cover;

a hinge assembly pivotally connecting the cover to the base; and a communication system comprising:

an arched first flat cable wrapping around the hinge assembly and rotatable with respect to the hinge assembly;

a straight second flat cable electrically connected to the first flat cable and disposed in the base;

an arched third flat cable wrapping around the first flat cable, electrically connected to the first flat cable, and rotatable with respect to the first flat cable; and a straight fourth flat cable electrically connected to the third flat cable and disposed in the cover.

5. The electronic device as claimed in claim 4, wherein the hinge assembly comprises:

an axle bed fixed to one of the base and the cover;

an axle body pivotally connected to the axle bed, and fixed to the other of the base and the cover; wherein the first flat cable wraps around the axle body and is rotatable with respect to the axle body and non-rotatable with respect to the axle bed.

6. The electronic device as claimed in claim 5, wherein an outer surface of the axle body is insulated.

7. The electronic device as claimed in claim 5, wherein the axle body comprises a joint axle and an insulating sleeve sleeved on the joint axle, the insulating sleeve insulating the first flat cable from the joint axle.

8. The electronic device as claimed in claim 7, wherein the joint axle is metal.

9. The electronic device as claimed in claim 5, wherein the axle bed comprises two first hinge subassemblies, with the axle body coaxially disposed therebetween.

10. The electronic device as claimed in claim 9, wherein each of the two first hinge subassemblies comprises a fastening arm and a first joint axle fixed thereto, with the fastening arm fixed to the base and the first joint axle coaxially connected to the axle body.

* * * * *